United States Patent d'Auria et al.

[11] 4,001,635
[45] Jan. 4, 1977

[54] ELECTRO-OPTICAL CONVERTER AND AN OPTICAL INFORMATION RECORDING SYSTEM COMPRISING SUCH A CONVERTER

[75] Inventors: Luigi d'Auria; Jean-Pierre Huignard; Jean Philippe Reboul; Francois Le Carvennec, all of Paris, France

[73] Assignee: Thomson-CSF, Paris, France

[22] Filed: June 10, 1975

[21] Appl. No.: 585,581

[30] Foreign Application Priority Data

June 14, 1974 France .................. 74.20713

[52] U.S. Cl. .................. 315/169 R; 250/216; 250/230; 250/568; 313/220; 340/173 LT; 340/173 PL; 350/161 S
[51] Int. Cl.[2] .................. G11C 13/08; G02F 1/31
[58] Field of Search ....... 315/169 R, 169 TV, 84.5; 250/550, 216, 230, 568; 350/3–5, 105, 161 S, DIG. 1; 313/220; 340/173 LT, 173 LS, 173 LM, 173 CR, 173 PL

[56] References Cited
UNITED STATES PATENTS

| 3,553,460 | 1/1971 | Preston, Jr. | 250/550 |
| 3,579,015 | 5/1971 | Gregory | 315/169 TV |
| 3,614,192 | 10/1971 | Preston, Jr. | 350/3.5 |
| 3,743,879 | 7/1973 | Kupsky | 315/169 TV |
| 3,883,215 | 5/1975 | Kurtz | 350/3.5 |

Primary Examiner—Eugene La Roche
Attorney, Agent, or Firm—Cushman, Darby & Cushman

[57] ABSTRACT

The present invention relates to an electro-optical converter with storage facility.

The converter is constituted essentially by a panel comprising a substrate covered by two dielectric layers, cells containing a gas being made in said substrate and two sets of electrodes arranged on said dielectric layers, one of the dielectric layers being a flexible diaphragm capable of local and permanent deformation under the action of electrostatic forces.

The invention is more particularly intended for the recording of optical information.

6 Claims, 3 Drawing Figures

ELECTRO-OPTICAL CONVERTER AND AN OPTICAL INFORMATION RECORDING SYSTEM COMPRISING SUCH A CONVERTER

The present invention relates in a general manner to the conversion of electrical data to optical data. The invention relates more particularly to an electro-optical converter which makes it possible to effect optical read-out of information received in the form of electrical signals; it likewise relates to an optical information recording system which employs the converter in accordance with the invention.

In a system for recording an optical store, the problem arises of effecting data input, the data frequently occurring in the form of electrical data. Amongst the various possible solutions, one which is compatible with binary information and has advantages as far as the access time and reproduceability are concerned, consists in utilising an initially flat reflective diaphragm capable of locally deforming under the action of electrical signals; the spatial distribution of the deformations, which distribution represents the information, makes it possible to effect optical read-out for example by reflection of a light beam.

It is well-known to effect this kind of deformation electrostatically with the help of a metallic diaphragm and an electrode, separated by a grid-type supporting structure for example. This device has a major drawback, namely the absence of any store: in other words, if the control voltage is removed, this voltage being applied between the electrode and the diaphragm, then the deformations disappear. To overcome this drawback, the store function can be performed by means of an associated electronic system which maintains the control voltage at any point on the device; however, this kind of solution is expensive since it requires complicated electronic circuits for the addressing of each point, and this situation becomes the worse the larger the quantity of data to be recorded.

The object of the present invention is an electro-optical converter which makes it possible to overcome the aforementioned drawbacks.

According to the invention, there is provided an electro-optical converter comprising: a substrate, with two parallel faces, wherein holes are made providing apertures on said two faces; two dielectric layers respectively arranged on said two faces, at least one of said layers being a flexible reflective diaphragm, a gas being arranged in the cells limited by said holes and said dielectric layers; two sets of electrodes respectively arranged on said two dielectric layers above said apertures, each set being formed by parallel electrodes in a direction making an angle other than zero with the electrodes of the other set; supply means for selectively supplying said electrodes in order to ionize the gas contained in the cells located between two electrodes supplied and to produce electrical charges which, in a first step, when deposited on said dielectric layers, produce electrostatic forces which deforms locally said flexible diaphragm and which, in a second step, neutralize electrical charges created in said first step; and means for delivering recording and erasing signals for respectively controlling said first and second steps.

The invention likewise relates to an optical information recording system comprising such a converter.

The invention will be better understood from a consideration of the ensuing description and the attached drawings in which.

Figure 1:
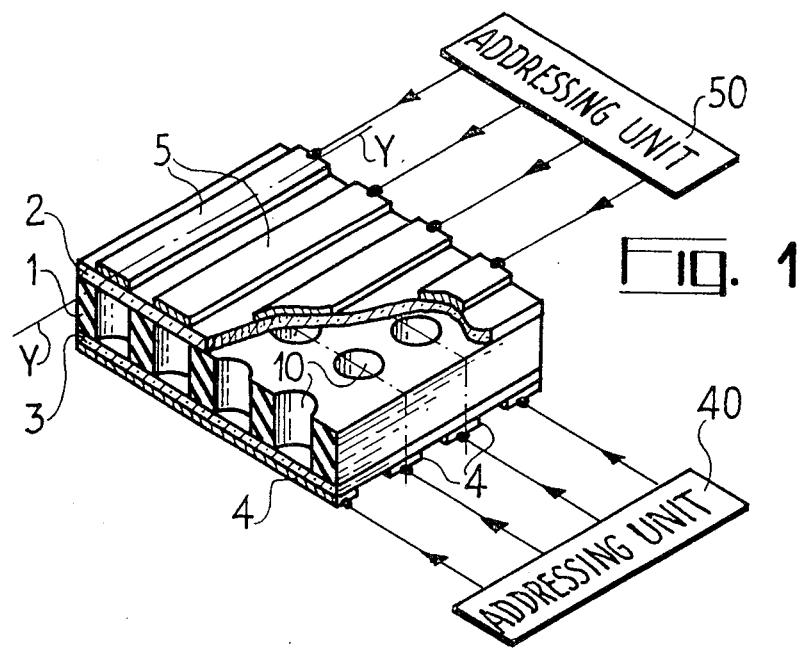
FIG. 1 illustrates an embodiment of the converter in accordance with the invention.

In FIG. 1, two layers 2 and 3 of dielectric materials, separated by a substrate 1 and covered on their external faces in each case by a series of electrodes (respectively 4 and 5 for the layers 3 and 2), have been shown.

The substrate 1 or matrix, is made of an insulating material containing cells 10 which contain a gas thus enclosed between the matrix 1 and the two dielectric layers 2 and 3.

The dielectric layer 2 is constituted by a flexible elastomeric diaphragm carrying the electrodes 5 which are substantially parallel with one another and arranged above the cells 10. The electrodes 4 are likewise parallel with one another but make an angle other than zero, for example 90°, with the electrodes 5 and are arranged in such a fashion that the intersections between the two sets of electrodes take place at the cells 10.

The electrodes 4 and 5 are respectively connected to two addressing units 40 and 50.

In operation, when an adequate striking voltage (Va) is applied to the terminals of a cell 10, that is to say between an electrode 4 and an electrode 5 intersecting at the cell in question, the gas contained in the cell is ionized. The ionization only lasts for a brief instant: the charges thus created and subjected to the inter-electrode field, gather upon the dielectric layers 2 and 3, creating a field opposite to the applied field until the ionization stops. Since the electrodes carrying the charges are electrically insulated from one another, cancellation of the striking voltage causes the ionization to vanish, thereby preventing any escape of the deposited charges. Accordingly, in the absence of a striking voltage, the field induced by the charges will last sufficiently to provide the required cell store or memory effect.

One of the dielectric layers, the layer 2, being constituted by a flexible diaphragm deforms in front of the cells which have been ionized, under the action of the electrostatic forces resulting from the charges deposited during ionization and in accordance with the law described in greater detail hereinafter, thus making it possible to record a piece of data. It should be pointed out that the electrodes 5 are metal deposits which are sufficiently thin not to disturb the deformation of the diaphragm 2.

The disappearance ionization the store field, that is to say the erasing of the previously recorded information, is performed by applying to the terminals of the cell a voltage S whose amplitude and sign must be such that inonization of the gas takes place, but of sufficient duration to create a new store field. It is advantageous to choose a voltage S of an amplitude close to the striking voltage Va and of the opposite sign.

The function of the units 40 and 50 is to perform the addressing of the cells 10, that is to say, to select in the conventional way the cells in which the information is to be recorded or erased. A convenient method of carrying out the recording of data in the overall device, is to previously erase the content of all the stores and then to record the data selectively. To carry out erasing, the assembly of the electrodes 5, known as column electrodes, may for example be supplied with a potential + S/2 and the assembly of the electrodes 4, known as the row electrodes, with a potential $-S/2$. To carry out recording, the first column electrode 5 is raised to a potential $+Va/2$ and those of the row electrodes 4 corresponding to cells in which recording is to take place in the first column, are raised to a potential of $-Va/2$; this process is repeated for each column and ultimately the initially electrical data are converted into local deformations of the diaphragm 2.

Figure 2:
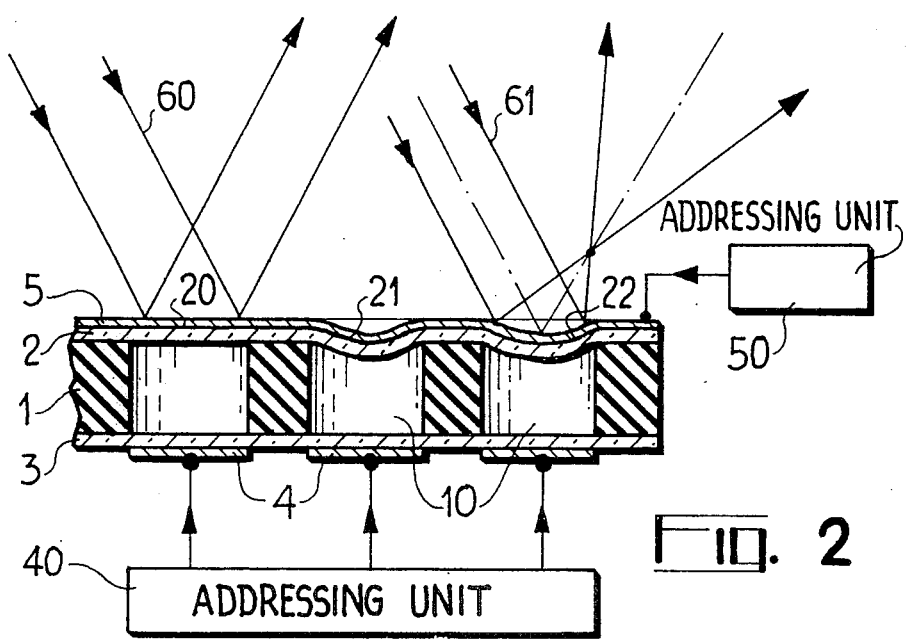
FIG. 2 is an explanatory diagram.

FIG. 2 is a diagram illustrating optical read-out of the information thus recorded.

In this figure, a section through the device shown in FIG. 1 on the axis YY, and the path taken by light rays incident upon the diaphragm 2 and the electrode 5 covering it have been shown. Thus, in this figure there can be seen: the matrix 1 in which the cells 10 are formed; the dielectric layer 3 covering one of the faces of the matrix and carrying the electrodes 4 which are connected to the addressing unit 40, and the deformable diaphragm 2 carrying the electrode 5 which is connected to the addressing unit 50. By way of example, the top face of the first cell has been shown non-distorted and has been marked 20, the top faces of the second and third cells has been shown in the distorted state and they are respectively marked 21 and 22.

The deformation of the diaphragm 2 located at 21 and 22 is produced by the uniform pressure due to the deposited charges. In accordance with the current formula of the theory of elasticity the electrostatic force resulting from the charges deposited upon the dielectrics 2 and 3. Calculations show that the this deformation is dependent on the cell diameter, the diaphragm modulus of elasticity and the density of the charges deposited following ionization. This is the case whether the electrodes have a width greater or less than the diameter of the cells; in FIG. 2, by way of example, electrodes 4 of width equal to the cell diameter have been shown.

A parallel light beam 60 incident upon the non-deformed face 20 is reflected as if by a flat mirror and remains parallel. A beam 61 of parallel light incident upon the deformed face 22 is no longer parallel after reflection but slightly divergent at a certain interval from the device.

The result is that if, for example, the device of FIG. 2 is illuminated with parallel light and if the screen is arranged at a certain interval from the device, symmetrically to the light source in relation to the plane of symmetry of the converter, then only the cells whose top face is deformed will cause the light to diverge, and this will be translated on the screen in the form of zones of very low illumination level corresponding to the deformed cells, the other zones of the screen being illuminated at a much higher level by the light rays which have remained parallel after reflection.

Such an electro-optical converter makes it possible to effect optical read-out of information received in electrical form and recorded in the form of mechanical deformations.

Figure 3:
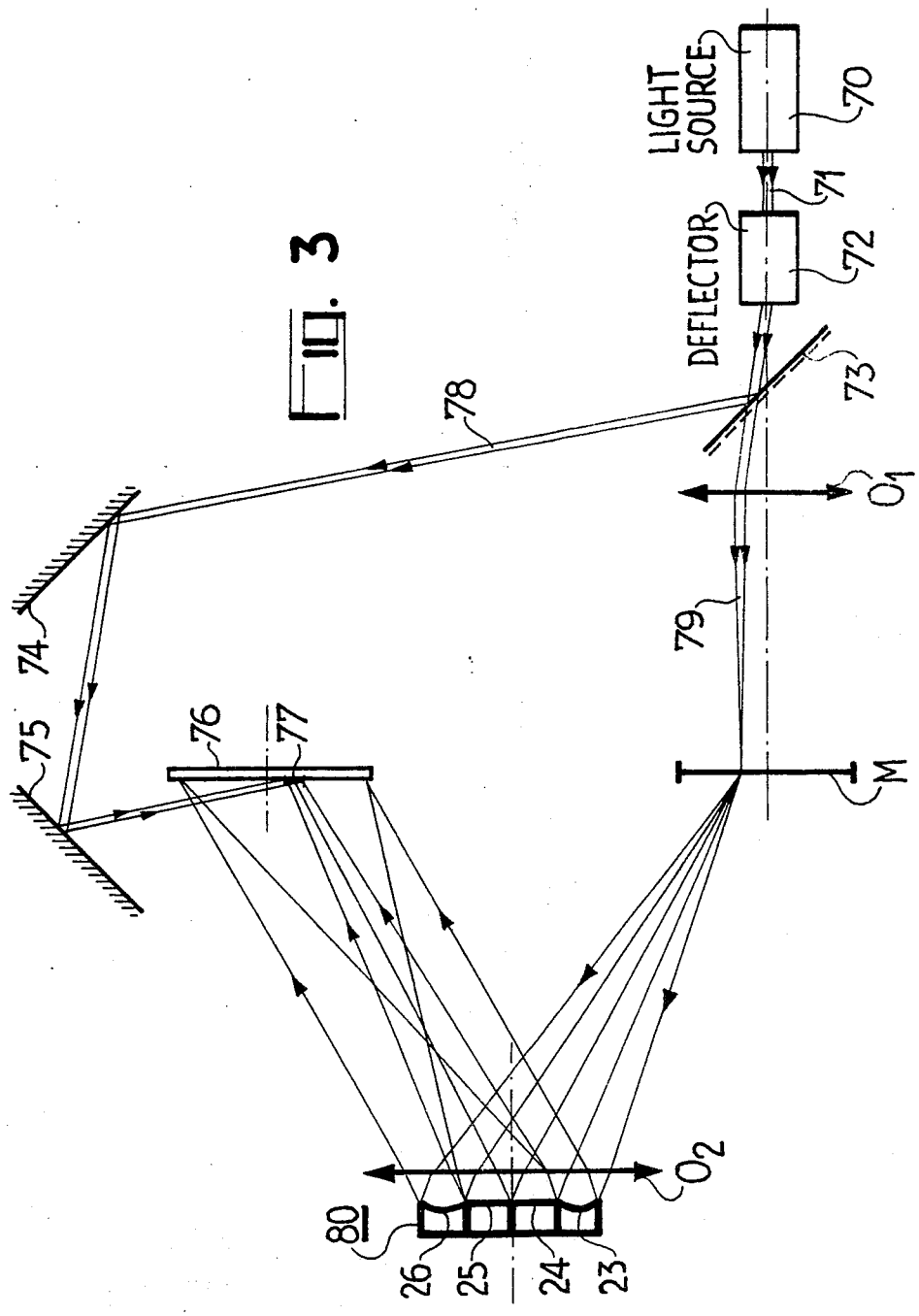
FIG. 3 illustrates an embodiment of the information recording system in accordance with the invention.

An application of this kind of converter to an optical information recording system, has been shown in FIG. 3. This system comprises a coherent light source 70, for example a laser, emitting a beam 71 towards a deflector 72 followed by a beam-splitter 73, the latter producing a beam 78 known as the reference beam and a beam 79 known as the object beam.

The deflector 72 enables the reference beam 78 to scan the surface of a plane 76 known as the store plane, constituted for example by a photosensitive plate on which holographic information recording is carried out, this after it has been guided for example by means of two flat mirrors 74 and 75; the deflection given to the beam 71 thus determines the position of a zone 77 or store page illuminated by the reference beam 78 in the store plane 76.

The trajectory of the object beam 79 is such that it illuminates the plane 77 after having been modulated by the converter in accordance with the invention, here marked 80. To this end, the beam 79 is rendered convergent by an objective lens $O_1$, at a point on a matrix of holographic lenses M, illuminating the converter 80 across an objective lens $O_2$ and, after reflection at the converter, causing the object beam to converge on the page 77.

For purposes of clarity, only four cells 23 to 26 have been shown in the converter 80, the cells 24 and 25 exhibiting no deformation and those 23 and 26 being deformed. In accordance with what has been stated earlier, those parts of the light beam 79 which strike the cells 24 and 25 not presenting any deformation, are focussed on the page 77 in each case in the form of a spot whose dimensions are fixed by the diffraction phenomena which are at work, and which is of sufficient intensity for the photosensitive plate to be printed with the interference pattern formed by interference with the beam 78; those parts of the light beam 79 which strike the cells 23 and 26 that have undergone deformation, diverge in such a fashion that the luminous intensity received by the page 77 is very low in relation to that coming from the cells 24 and 25.

In this fashion, a holographic system of recording an optical store has been performed, the store for example being organised in pages form so that with each page there corresponds a set of binary data initially presented in electrical form.

By way of example, the converter in accordance with the invention has been built with $10^3$ to $10^4$ cells at a pitch interval of 0.2 to 0.5 mm, yielding switching times in the order of one microsecond.

The description given hereinbefore is in no way intended as limitative of the scope of the invention. Thus, for example, it is within the scope of the invention to utilise a charge deposit produced by the plasma panel technique, in order to control instead of the diaphragm, an electro-optical material and thus create an electro-optical converter.

What we claim is:
1. An electro-optical converter comprising: a substrate, with two parallel faces, wherein holes are made providing apertures on said two faces; two dielectric layers respectively arranged on said two faces, at least one of said layers being a flexible reflective diaphragm, a gas being arranged in the cells limited by said holes and said dielectric layers; two sets of electrodes respectively arranged on said two dielectric layers above said apertures, each set being formed by parallel electrodes in a direction making an angle other than zero with the electrodes of the other set; supply means for selectively supplying said electrodes in order to ionize the gas contained in the cells located between two electrodes supplied and to produce electrical charges which, in a first step, when deposited on said dielectric layers, produce electrostatic forces which deforms locally said flexible diaphragm and which, in a second step, neutralize electrical charges created in said first step, said supply means being adapted for receiving recording and erasing electrical control signals for respectively controlling said first and second steps.

2. A converter as claimed in claim 1, wherein said angle is around $\pi/2$.

3. A converter as claimed in claim 2 wherein said holes are cylindrical.

4. A converter as claimed in claim 3, wherein said set of electrodes which is arranged on said flexible diaphragm is constituted by metal deposits having a width at least equal to the diameter of said holes.

5. A converter as claimed in claim 4, wherein said supply means produce, in response to said recording signal of electrical kind, a first voltage referred to as the striking voltage ionizating the gas and producing electrostatic forces and, in response to said erasing signal of electrical kind, a second voltage the amplitude and duration of which are such that ionization of the gas takes place without any charge deposit forming.

6. An optical information recording system comprising a converter as claimed in claim 5; a coherent light source emitting a light beam; means for deflecting said beam; means for splitting said beam into a first beam known as a reference beam and a second beam known as the object beam; means for guiding said reference beam towards a zone of a plane known as the store plane, the position of the zone being determined by said deflection means; means for guiding said object beam towards, said zone after reflection at and consequently modulation by, said converter; and a photosensitive material arranged in said store plane in order to record the interference pattern formed in said zone by interference between the reference beam and the modulated object beam.

* * * * *